(12) United States Patent
Chiu et al.

(10) Patent No.: US 9,379,126 B2
(45) Date of Patent: Jun. 28, 2016

(54) DAMASCENE CONDUCTOR FOR A 3D DEVICE

(71) Applicant: Macronix International Co., Ltd., Hsinchu (TW)

(72) Inventors: Chiajung Chiu, Hsinchu (TW); Guanru Lee, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 85 days.

(21) Appl. No.: 13/935,375

(22) Filed: Jul. 3, 2013

(65) Prior Publication Data

US 2014/0264897 A1 Sep. 18, 2014

Related U.S. Application Data

(60) Provisional application No. 61/781,015, filed on Mar. 14, 2013.

(51) Int. Cl.
*H01L 27/115* (2006.01)
*H01L 21/28* (2006.01)

(52) U.S. Cl.
CPC .... *H01L 27/11568* (2013.01); *H01L 21/28282* (2013.01); *H01L 27/11578* (2013.01)

(58) Field of Classification Search
None
See application file for complete search history.

(56) References Cited

U.S. PATENT DOCUMENTS

| | | | |
|---|---|---|---|
| 4,630,086 A | 12/1986 | Sato et al. | |
| 5,286,994 A | 2/1994 | Ozawa et al. | |
| 5,319,229 A | 6/1994 | Shimoji et al. | |
| 5,773,335 A * | 6/1998 | Chao | H01L 21/823892 257/E21.644 |
| 5,851,881 A | 12/1998 | Lin et al. | |
| 5,952,692 A | 9/1999 | Nakazato et al. | |
| 6,011,725 A | 1/2000 | Eitan | |
| 6,026,026 A | 2/2000 | Chan et al. | |

(Continued)

FOREIGN PATENT DOCUMENTS

| | | |
|---|---|---|
| EP | 0016246 A1 | 10/1980 |
| EP | 1411555 A2 | 4/2004 |

(Continued)

OTHER PUBLICATIONS

Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.

(Continued)

*Primary Examiner* — Charles Garber
*Assistant Examiner* — Stanetta Isaac
(74) *Attorney, Agent, or Firm* — Haynes Beffel & Wolfeld LLP

(57) ABSTRACT

A method of forming a conductor structure can result in vertical sidewalls. The method deposits a lining over a plurality of spaced-apart stacks of active layers. An isolation material is formed over the lining, over and in between the spaced-apart stacks. A plurality of trenches in the isolation material is arranged to cross over the plurality of spaced-apart stacks of active strips, leaving at least a residue of the lining on a bottom of the trenches between the stacks of active strips and over a sidewall of the spaced-apart stacks of active strips. The residue of the lining on the bottom of the trenches and the sidewalls of the spaced-apart stacks of active layers is selectively removed. Then the plurality of trenches is filled with conductive or semiconductor material to form the damascene structure.

12 Claims, 12 Drawing Sheets

(56) References Cited

U.S. PATENT DOCUMENTS

| | | | |
|---|---|---|---|
| 6,034,882 A | 3/2000 | Johnson et al. | |
| 6,074,917 A | 6/2000 | Chang et al. | |
| 6,133,603 A | 10/2000 | Nomoto | |
| 6,169,693 B1 | 1/2001 | Chan et al. | |
| 6,218,700 B1 | 4/2001 | Papadas | |
| 6,287,915 B1 | 9/2001 | Muramatsu | |
| 6,333,214 B1 | 12/2001 | Kim et al. | |
| 6,475,847 B1 | 11/2002 | Ngo et al. | |
| 6,512,696 B1 | 1/2003 | Fan et al. | |
| 6,531,359 B1 | 3/2003 | Tempel et al. | |
| 6,605,840 B1 | 8/2003 | Wu | |
| 6,657,253 B2 | 12/2003 | Kwon et al. | |
| 6,709,928 B1 | 3/2004 | Jenne et al. | |
| 6,713,315 B2 | 3/2004 | Kuo et al. | |
| 6,720,630 B2 | 4/2004 | Mandelman et al. | |
| 6,784,480 B2 | 8/2004 | Bhattacharyya | |
| 6,818,558 B1 | 11/2004 | Rathor et al. | |
| 6,897,533 B1 | 5/2005 | Yang et al. | |
| 6,906,361 B2 | 6/2005 | Zhang | |
| 6,906,940 B1 | 6/2005 | Lue | |
| 6,912,163 B2 | 6/2005 | Zheng et al. | |
| 6,977,201 B2 | 12/2005 | Jung | |
| 7,005,350 B2 | 2/2006 | Walker et al. | |
| 7,075,828 B2 | 7/2006 | Lue et al. | |
| 7,081,377 B2 | 7/2006 | Cleeves | |
| 7,115,469 B1 | 10/2006 | Halliyal et al. | |
| 7,115,942 B2 | 10/2006 | Wang | |
| 7,129,538 B2 | 10/2006 | Lee et al. | |
| 7,133,313 B2 | 11/2006 | Shih | |
| 7,151,692 B2 | 12/2006 | Wu | |
| 7,164,603 B2 | 1/2007 | Shih et al. | |
| 7,177,169 B2 | 2/2007 | Scheuerlein | |
| 7,187,590 B2 | 3/2007 | Zous et al. | |
| 7,190,614 B2 | 3/2007 | Wu | |
| 7,209,390 B2 | 4/2007 | Lue et al. | |
| 7,236,394 B2 | 6/2007 | Chen et al. | |
| 7,274,594 B2 | 9/2007 | Pascucci et al. | |
| 7,315,474 B2 | 1/2008 | Lue | |
| 7,382,647 B1 | 6/2008 | Gopalakrishnan | |
| 7,420,242 B2 | 9/2008 | Lung | |
| 7,459,715 B2 | 12/2008 | Toda et al. | |
| 7,569,468 B2 | 8/2009 | Chen et al. | |
| 7,622,389 B1* | 11/2009 | Min | H01L 27/11548 257/315 |
| 7,851,849 B2 | 12/2010 | Kiyotoshi | |
| 7,995,371 B2 | 8/2011 | Rinerson et al. | |
| 8,199,576 B2 | 6/2012 | Fasoli et al. | |
| 8,503,213 B2 | 8/2013 | Chen et al. | |
| 2003/0025147 A1 | 2/2003 | Nomoto et al. | |
| 2003/0030100 A1 | 2/2003 | Lee et al. | |
| 2003/0032242 A1 | 2/2003 | Lee et al. | |
| 2003/0042534 A1 | 3/2003 | Bhattacharyya | |
| 2003/0047755 A1 | 3/2003 | Lee et al. | |
| 2003/0067024 A1* | 4/2003 | Kim | H01L 27/108 257/296 |
| 2003/0146465 A1 | 8/2003 | Wu | |
| 2003/0224564 A1 | 12/2003 | Kang et al. | |
| 2004/0079983 A1 | 4/2004 | Chae et al. | |
| 2004/0102002 A1 | 5/2004 | Sandhu et al. | |
| 2004/0183126 A1 | 9/2004 | Bae et al. | |
| 2004/0238974 A1 | 12/2004 | Baik | |
| 2004/0256679 A1 | 12/2004 | Hu | |
| 2005/0006696 A1 | 1/2005 | Noguchi et al. | |
| 2005/0023603 A1 | 2/2005 | Eldridge et al. | |
| 2005/0040456 A1* | 2/2005 | Specht | H01L 21/28273 257/315 |
| 2005/0074937 A1 | 4/2005 | Jung | |
| 2005/0093054 A1 | 5/2005 | Jung | |
| 2005/0219906 A1 | 10/2005 | Wu | |
| 2005/0237801 A1 | 10/2005 | Shih | |
| 2005/0237809 A1 | 10/2005 | Shih et al. | |
| 2005/0237813 A1 | 10/2005 | Zous et al. | |
| 2005/0237815 A1 | 10/2005 | Lue et al. | |
| 2005/0237816 A1 | 10/2005 | Lue et al. | |
| 2005/0270849 A1 | 12/2005 | Lue | |
| 2005/0280061 A1 | 12/2005 | Lee | |
| 2005/0281085 A1 | 12/2005 | Wu | |
| 2006/0088983 A1 | 4/2006 | Fujisawa et al. | |
| 2006/0097341 A1 | 5/2006 | Pellizzer et al. | |
| 2006/0124991 A1 | 6/2006 | Ohba | |
| 2006/0198189 A1 | 9/2006 | Lue et al. | |
| 2006/0198190 A1 | 9/2006 | Lue | |
| 2006/0202252 A1 | 9/2006 | Wang et al. | |
| 2006/0202261 A1 | 9/2006 | Lue et al. | |
| 2006/0223297 A1* | 10/2006 | Seo | 438/597 |
| 2006/0258090 A1 | 11/2006 | Bhattacharyya et al. | |
| 2006/0261401 A1 | 11/2006 | Bhattacharyya | |
| 2006/0281260 A1 | 12/2006 | Lue | |
| 2007/0012988 A1 | 1/2007 | Bhattacharyya | |
| 2007/0029625 A1 | 2/2007 | Lue et al. | |
| 2007/0031999 A1 | 2/2007 | Ho et al. | |
| 2007/0045718 A1 | 3/2007 | Bhattacharyya | |
| 2007/0069283 A1 | 3/2007 | Shih et al. | |
| 2007/0140001 A1 | 6/2007 | Motoi et al. | |
| 2007/0253233 A1 | 11/2007 | Mueller et al. | |
| 2008/0073635 A1 | 3/2008 | Kiyotoshi | |
| 2008/0096327 A1 | 4/2008 | Lee et al. | |
| 2008/0101109 A1 | 5/2008 | Haring-Bolivar et al. | |
| 2008/0106931 A1 | 5/2008 | Toda | |
| 2008/0175032 A1 | 7/2008 | Tanaka et al. | |
| 2008/0180994 A1 | 7/2008 | Katsumata et al. | |
| 2008/0247230 A1 | 10/2008 | Lee et al. | |
| 2008/0285350 A1 | 11/2008 | Yeh | |
| 2009/0097321 A1 | 4/2009 | Kim et al. | |
| 2009/0166723 A1 | 7/2009 | Sung et al. | |
| 2009/0184360 A1 | 7/2009 | Jin et al. | |
| 2009/0278193 A1 | 11/2009 | Murata et al. | |
| 2010/0226195 A1 | 9/2010 | Lue | |
| 2010/0270593 A1 | 10/2010 | Lung et al. | |
| 2010/0322000 A1 | 12/2010 | Shim et al. | |
| 2010/0327323 A1* | 12/2010 | Choi | G11C 16/0483 257/202 |
| 2011/0095353 A1 | 4/2011 | Lue | |
| 2011/0149656 A1 | 6/2011 | Tang et al. | |
| 2011/0216604 A1 | 9/2011 | Mikajiri et al. | |
| 2011/0312174 A1* | 12/2011 | Lee | H01L 27/11582 438/595 |
| 2012/0007167 A1 | 1/2012 | Hung et al. | |
| 2012/0051137 A1 | 3/2012 | Hung et al. | |
| 2012/0168849 A1 | 7/2012 | Choi et al. | |
| 2012/0181580 A1* | 7/2012 | Lue | H01L 29/792 257/208 |
| 2012/0181599 A1 | 7/2012 | Lung | |
| 2012/0181654 A1 | 7/2012 | Lue | |
| 2012/0181684 A1 | 7/2012 | Lue et al. | |
| 2012/0182801 A1 | 7/2012 | Lue | |
| 2012/0182802 A1 | 7/2012 | Hung et al. | |
| 2012/0182807 A1 | 7/2012 | Lue | |
| 2012/0182808 A1* | 7/2012 | Lue | G11C 16/0466 365/185.18 |
| 2012/0235224 A1 | 9/2012 | Yeh | |
| 2012/0236642 A1 | 9/2012 | Lue | |
| 2012/0287706 A1 | 11/2012 | Lung | |
| 2012/0299115 A1* | 11/2012 | Chuang et al. | 257/379 |
| 2012/0327714 A1 | 12/2012 | Lue | |
| 2013/0003434 A1 | 1/2013 | Lue et al. | |
| 2013/0023115 A1 | 1/2013 | Fan et al. | |
| 2013/0119455 A1* | 5/2013 | Chen | H01L 27/11578 257/324 |
| 2013/0175598 A1 | 7/2013 | Chen et al. | |
| 2013/0182487 A1 | 7/2013 | Lee et al. | |

FOREIGN PATENT DOCUMENTS

| | | |
|---|---|---|
| EP | 1936681 A1 | 6/2008 |
| EP | 2048709 A2 | 4/2009 |
| JP | 11040682 A | 2/1999 |
| JP | 2003068893 A | 3/2003 |
| JP | 2004363329 A | 12/2004 |
| JP | 2005184029 A | 7/2005 |
| JP | 2005197624 A | 7/2005 |
| KR | 20010056888 A | 7/2001 |

(56) References Cited

FOREIGN PATENT DOCUMENTS

| | | |
|---|---|---|
| KR | 20050011203 A | 1/2005 |
| TW | 201232714 A | 8/2012 |
| TW | 201301446 A | 1/2013 |

OTHER PUBLICATIONS

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4.
Blomme et al., "Multilayer tunneling barriers for nonvolatile memory applications," Device Research Conf, 2002 60th DRC Digest 153-154.
Blomme et al., "Write/Erase Cycling Endurance of Memory Cells with SiO2/HfO2 Tunnel Dielectric," IEEE Trans. on Dev. and Mterials Reliability 4(3), Sep. 2004 345-351.
Buckley, J., et al., "Engineering of 'Conduction Band-Crested Barriers' or 'Dielectric Constant-Crested Barriers' in view of their application of floating-gate non-volatile memory devices," VLSI 2004, 55-56.
Chen et al., "Damascene Word Line", U.S. Appl. No. 13/527,259 filed on Jun. 19, 2012, 76 pages.
Chen, Y-C. et al., "An Access-Transistor-Free (0T/1R) Non-Volatile Resistance Random Access Memory (RRAM) Using a Novel Threshold Switching, Self-Rectifying Chalcogenide Device," IEDM 2003, pp. 37.4.1-37.4.4.
Chindalore, et al., "A New Combination-Erase Technique for Erasing Nitride Based (SONOS) Nonvolatile Memories," IEEE Electron Dev. Lett. 24(4) Apr. 2003, 257-259.
Cho, et al., "Simultaneous Hot-Hole Injection at Drain and Source for Efficient Erase and Excellent Endurance in SONOS Flash EEPROM CELLS," IEEE Electron Device Letters, vol. 24, No. 4, Apr. 2003, 260-262.
Choi et al., "Performance Breakthrough in nor Flash Memory With Dopant-Segregated Schottky-Barrier (DSSB) Sonos Devices," Jun. 2009 Symposium on VLSI Technology Digest of Technical Papers, pp. 222-223.
DiMaria, D.J., et al., "Conduction Studies in Silicon Nitride: Dark Currents and Photocurrents," IBM J. Res. Dev. May 1977, 227-244.
Eitan, et al., "NROM: A Novel Localized Trapping, 2-Bit Nonvolatile Memory Cell," IEEE Electron Device Lett 21(11) Nov. 2000, 543-545.
European Search Report from EP07252779 mailed Nov. 5, 2009, 7 pages.
Fukuzumi et al. "Optimal Integration and Characteristics of Vertical Array Devices for Ultra-High Density, Bit-Cost Scalable Flash Memory," IEEE Dec. 2007, pp. 449-452.
Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.
Govoreanu et al., "Simulation of Nanofloating Gate Memory with High-k Stacked Dielectrics," IEEE SISPAD Intl. Conf. Sep. 3-5, 2003 299-302.
Govoreanu et al., "VARIOT: A Novel Multilayer Tunnel Barrier Concept for Low-Voltage Nonvolatile Memory Devices," IEEE Electron Dev. Lett. 24(2) Feb. 2003 94-10.
Hijiya, S., et al., "High-Speed Write/Erase EAROM Cell with Graded Energy Band-Gap Insulator," Electronics and Communications in Japan, Part 2, vol. 68, No. 2, Jun. 6, 1984, 28-36.
Hinkle, C.L., et al., "Enhanced tunneling in stacked gate dielectrics with ultra-thin HfO2 (ZrO2) layers sandwiched between thicker SiO2 layers," Surface Science, Sep. 20, 2004, vol. 566-568, 1185-1189.
Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.
Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.
Ito, et al., "A Novel MNOS Technology Using Gate Hole Injection in Erase Operation for Embedded Nonvolatile Memory Applications." 2004 Symp. on VLSI Tech Dig. of Papers 2004, 80-81.
Jang et al., "Vertical Cell Array Using TCAT (Terabit Cell Array Transistor) Technology for Ultra High Density Nand Flash Memory," 2009 Symposium on VLSI Technology Digest of Technical Papers, Jun. 16-18, 2009, pp. 192-193.
Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.
Jung et al., "Three Dimensionally Stacked NAND Flash Memory Technology Using Stacking Single Crystal Si Layers on ILD and TANOS Structure for Beyond 30nm Node," IEEE IEDM Dec. 11-13, 2006, 4 pages.
Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.
Kau DC, et al., "A stackable cross point phase change memory," 2009 International Electron Devices Meeting, Baltimore MD, pp. 27.1.1-27.1.4.
Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.
Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.
Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.
Kim et al., "Robust Multi-Bit Programmable Flash Memory Using a Resonant Tunnel Barrier," Electron Dev. Mtg. Dec. 5-7, 2005, IEDM Technical Digest 861-864.
Kim, Moon Kyung, et al., "The Effects of ONO thickness on Memory Characteristics in Nano-scale Charge Trapping Devices," Int'l Symp on VLIS Technology, Systems and Applications, Apr. 23-25, 2007, pp. 1-2.
Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.
Lai et al., "Highly Reliable MA BE-SONOS (Metal-Al2 O3 Bandgap Engineered SONOS) Using a SiO2 Buffer Layer,"VLSI Technology, Systems and Applications, 2008, VLSI-TSA 2008 International Symposium on Apr. 21-23, 2008, pp. 58-59.
Lai, et al., "Damascene Conductor for 3D Array," U.S. Appl. No. 13/897,702, filed on May 20, 2013, 56 pages.
Lai, Sheng-Chih, et al., "A Study on the Erase and Retention Mechanisms for MONOS, MANOS, and BE-SONOS Non-Volatile Memory Devices," Int'l Symp on VLSI Technology, Systems and Applications, Apr. 23-25, 2007, pp. 1-2.
Lee, Chang, et al., "A Novel Sonos Structure of SiO2/SiN/Al2O3 with TaN Metal Gate for Multi-Giga Bit Flash Memeries," IEEE 2003, 4 pages.
Lee, Chungho, et al., "Operational and Reliability Comparison of Discrete-Storage Nonvolatile Memories: Advantages of Single-and Double-Layer Metal Nanocrystals," IEEE IEDM 03-557, 22.6.1-22.6.4.
Li F., et al., "Evaluation of SIO2 Antifuse ina 3D-OTP Memory," IEEE Transaction on Device and Materials Reliability, vol. 4, No. 3, 2004, pp. 416-421.
Likharev, "Layered Tunnel Barriers for Nonvolatile Memory Devices," Appl. Phys. Lett. 73(15) Oct. 1998 2137-2139.
Lue et al., "A BE-SONOS (Bandgap Engineered SONOS) NAND for Post-Floating Gate Era Flash Memory," Int'l Symp on VLSI Tech, Apr. 23-25, 2007, 2 pages.
Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

(56) References Cited

OTHER PUBLICATIONS

Lue et al., "A Novel P-Channel NAND-Type Flash memory with 2-bit/cell Operation and High Programming Throughput (>20 MB/sec)," IEEE 2005, 4 pages.

Lue et al., "BE-SONOS: A Bandgap ENGINEERED Sonos with Excellent Performance and Reliability," IEDM Tech. Digest Dec. 2005 547-550.

Maikap, S., et al., "High-k HfO2/TiO2/Hf02 multilayer quantum well flash memory devices," Int'l Symp on VLSI Technology, Sytems and Applications Apr. 23-25, 2007, pp. 1-2.

Office Action mailed Oct. 19, 2007 in U.S. Appl. No. 11/324,495.

Office Action mailed Nov. 23, 2007 in U.S. Appl. No. 11/197,668.

Sasago Y., et al., "Cross-point phase change memory with 4F2 cell size driven by low-contact-resistivity poly-Si diode," 2009 Symposium on VLSI Technology Digest of Tech. Papers, pp. 24-25.

Shih et al., "A Novel 2-bit/cell Nitride Storage Flash Memory with Greater than 1M P/E-cycle Endurance," IEEE IEDM 2004 881-884 (36.3.1-36.3.4).

Sung et al., "Multi-Layer SONOS with Direct Tunnel Oxide for High Speed and Long Retention Time," IEEE Silicon Nanoelectronics Workshop Jun. 2002 83-84.

Takata, M., et al., "New Non-Volatile Memory with Extremely High Density Metal Nano-Dots," IEEE IEDM 03-553, 22.51-22.5.4.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Tsai et al., "Novel SONOS-Type Nonvolatile Memory Device with Suitable Band Offset in HfAIO Charge-Trapping Layer," Int'l Symp. on VLSI Tech, Systems and Applications, Apr. 23-25, 2007, 2 pages.

Walker et al., "3D TFT-SONOS Memory Cell for Ultra-High Density File Storage Applications," 2003 Symposium on VLSI Tech Digest of Technical Papers, 29-30.

Wen, Huang-Chun, et al., "Issues associated with p-type band-edge effective work function metal electrodes: Fermi-level pinning and flatband roll-off," In'l Symp on VLSI Technology, Systems and Applications, Apr. 23-25, 2007, 2 pages.

White et al., "On the Go with SONOS" IEEE Circuits and Devices, Jul. 2000, 22-31.

Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007, 214-216.

Yamada et al., "A self-convergence erasing scheme for a simple stacked gate flash EEPROM," Proc. Int'l. Electron Devices Meeting, Dec. 1991 307-310.

Yeh, C.C., et al., "PHINES: A Novel Low Power Program/Erase, Small Pitch, 2-Bit per Cell Flash Memory," IEDM Tech Digest 2002, 931-934.

Yun et al, "Stacked-nanowire device with virtual source/drain (SD-VSD) for 3D NAND flash memory application," Solid-State Electronics, vol. 64, pp. 42-46 (Jul. 26, 2011).

Yun et al., "Single-Crystalline Si STacked ARray (STAR)," IEEE Trans. Electron. Devices, vol. 58, pp. 1006-1014 (Apr. 2011).

Paul et al., "Impact of a Process Variation on Nanowire and Nanotube Device Performance," IEEE Trans. on Electron Devices, vol. 54, No. 9, Sep. 2007, pp. 2369-2376.

Padilla, Alvaro, et al., "Dual-bit SONOS FinFET Non-Volatile Memory Cell and New Method of Charge Detection," Int'l Symp on VLSI Technology, Systems and Applications, Apr. 23-25, 2007, 2 pages.

Minami, et al., "New Scaling Guidelines for MNOS Nonvolatile Memory Devices," IEEE Trans on Electron Devices 38 (11) Nov. 1991 2519-2526.

US Office Action Dated Oct. 7, 2014 in U.S. Appl. No. 13/897,702, 52 pages.

\* cited by examiner

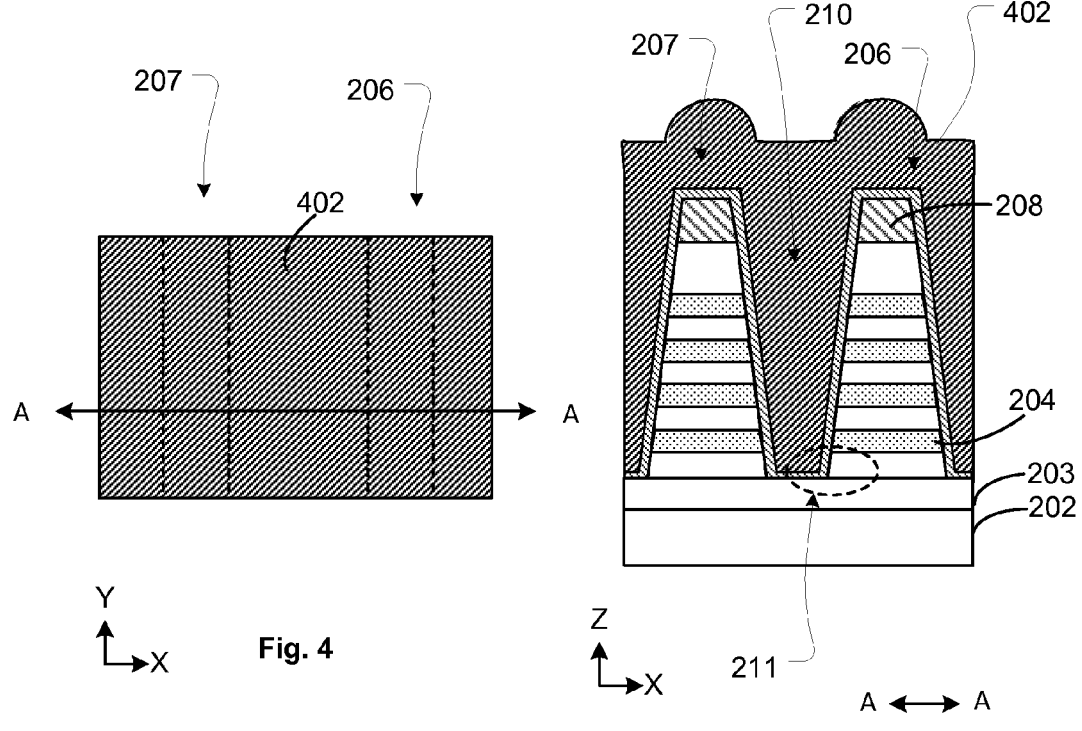

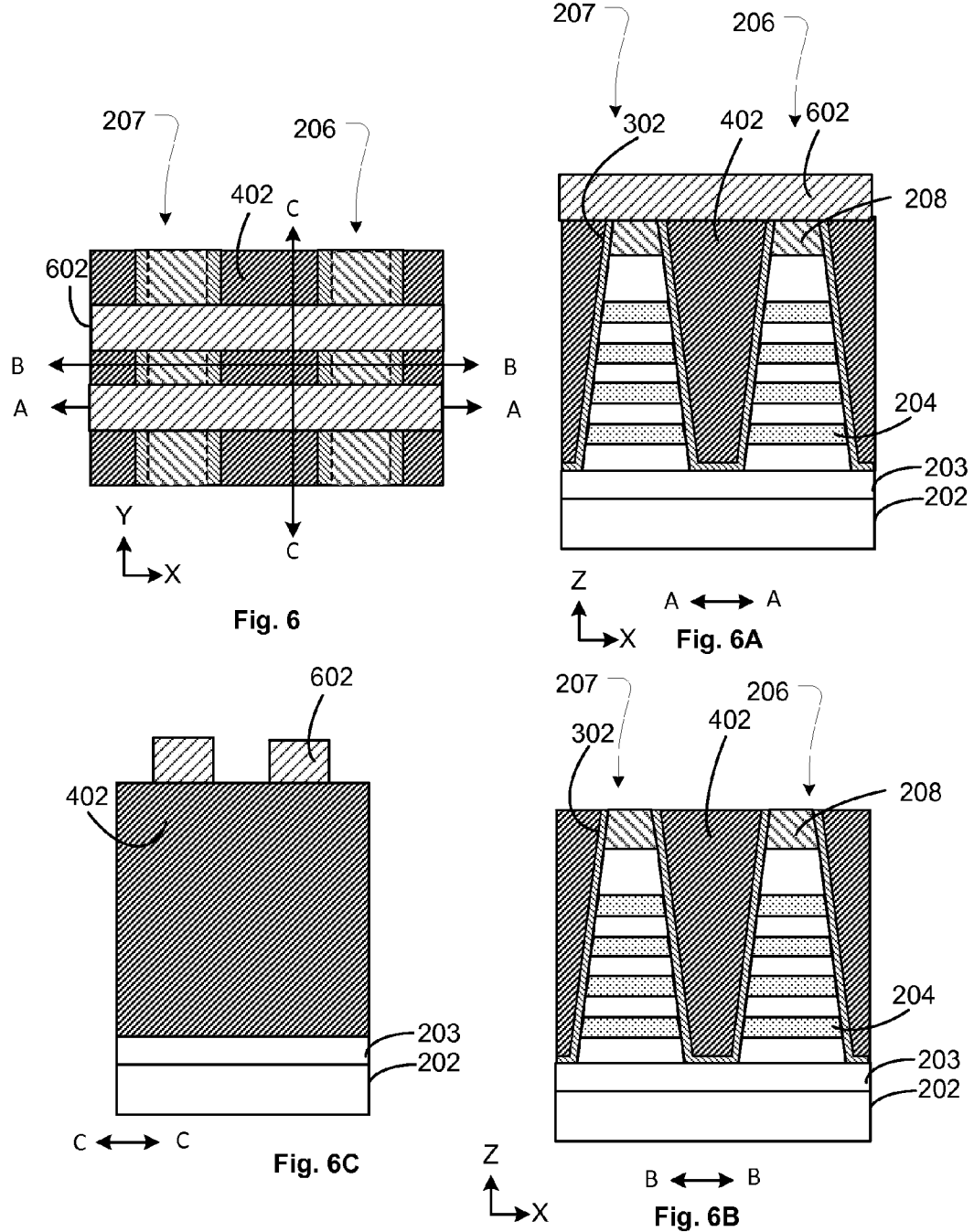

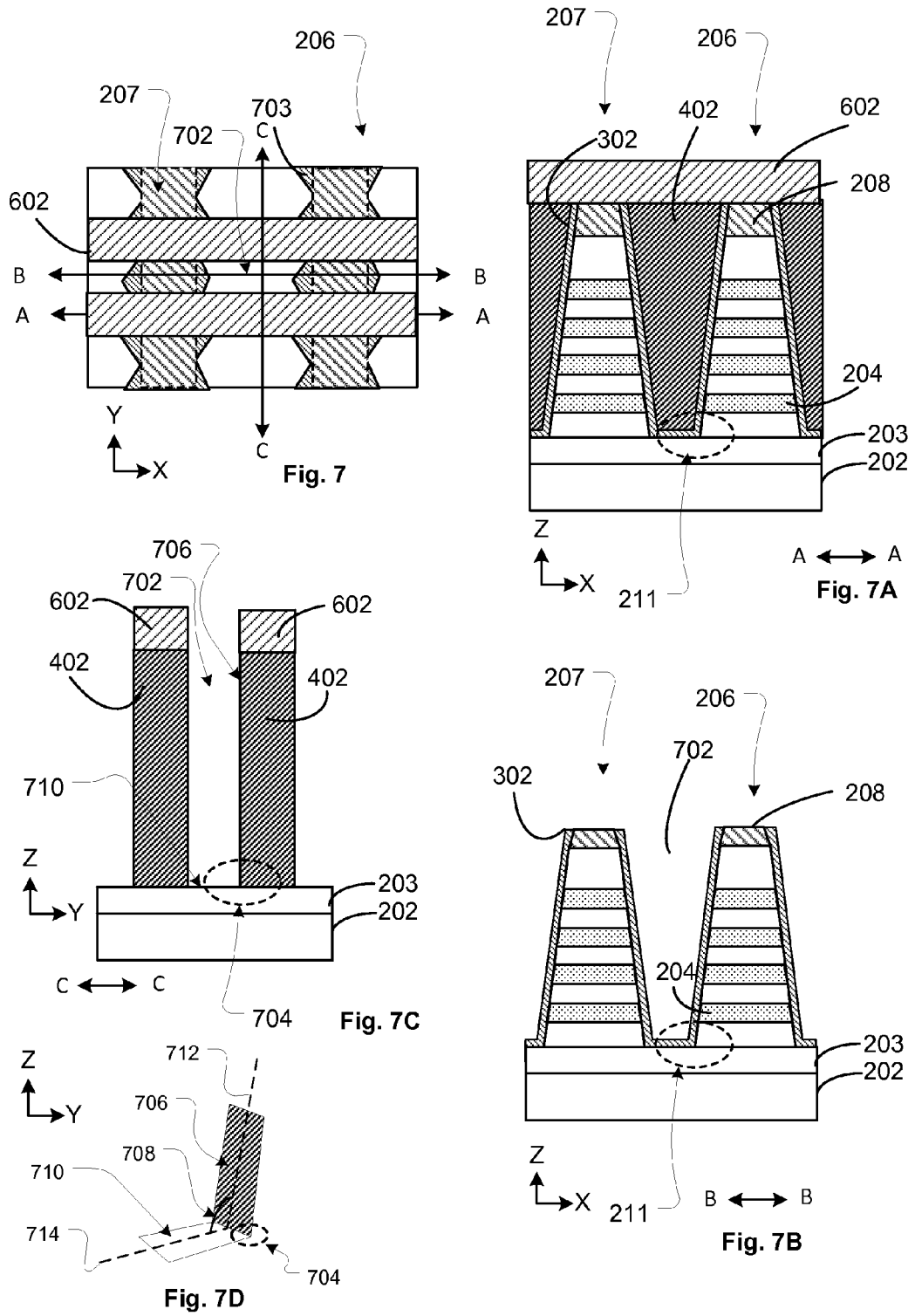

DAMASCENE CONDUCTOR FOR A 3D DEVICE

RELATED APPLICATIONS

This application claims the benefit of U.S. Provisional Patent Application No. 61/781,015 filed on 14 Mar. 2013, which application is incorporated by reference as if fully set forth herein.

BACKGROUND

The present invention relates to high density integrated circuit devices. In particular, embodiments according to the present invention provide a method for manufacturing and a structure for a conductor connected to multiple planes in a three-dimensional high density device.

Three dimensional (3D) memory devices are characterized by multiple layers, each of which can include a planar array of memory cells. Conductors, that connect to multiple planes, such as a high density word line or bit line structure, can present manufacturing difficulties for 3D memory devices.

SUMMARY

For certain three-dimensionally stacked integrated circuit devices, active layers such as bit lines or word lines for memory cells are stacked in spaced-apart ridge-like structures arranged to extend in a first direction. In such structures, complementary word lines or bit lines can be configured that include damascene features between the spaced-apart ridges in a high aspect ratio trench or trenches arranged to be aligned in a second direction, such as perpendicular to the first direction. The damascene conductors can be formed by lining the spaced-apart ridges using a lining material followed by forming an insulating fill material between the spaced apart ridges. A plurality of openings such as trenches that cross over the spaced-apart ridges is formed in the insulating fill material using a first etch process. Side walls of the spaced-apart ridges within the trenches are exposed, while at least a part of the lining material remains on side walls of the spaced-apart ridges. The lining, including those in the corners at the bottom of the trenches, has an etch rate greater than the insulating fill material in a selected etch process. The remaining lining material can be further weakened by exposure to radiation, such as energized particles. As weakened, the remaining lining material between the spaced-apart ridges and in the corners can be preferentially removed using the second etch process which can be for example, a wet etch process. The trenches thus formed have straighter corners and a more vertical wall (relative to a substrate surface) because of removal of the lining from the trenches can be achieved using the second etch process less effective on the insulating fill, while exposing the insulating fill to the first etch process for a shorter time. The trenches can be used as a damascene mold for a conductor structure where a conductor material is deposited in the trenches to form a damascene conductor. The conductive material can be for example, a metal material, a semiconductor material or combinations of materials.

The damascene conductor thus formed can act as a bit line or word line for a 3D memory. In such 3D memory, memory cells are disposed at the cross-points of the stacked bit lines or word lines and the crossing word lines or bit lines, forming a 3D memory array.

Many benefits can be achieved by ways of present invention over conventional techniques. For example, the present method can be applied to form a high aspect ratio conductor structure having desirable straight corners and a substantially vertical wall thus maintaining a profile of each of the spaced-apart stacks. Various other aspects and advantages are described throughout the specification and the appended claims.

BRIEF DESCRIPTION OF THE DRAWINGS

FIGS. 2-11, 2A-7A, 9A-11A, 6B, 7B, 9B-11B, and 6C, 7C, 9C, 10C-11C, 7D illustrate stages in a method for forming a conductor structure for a 3D memory device.

DETAILED DESCRIPTION

Figure 1:
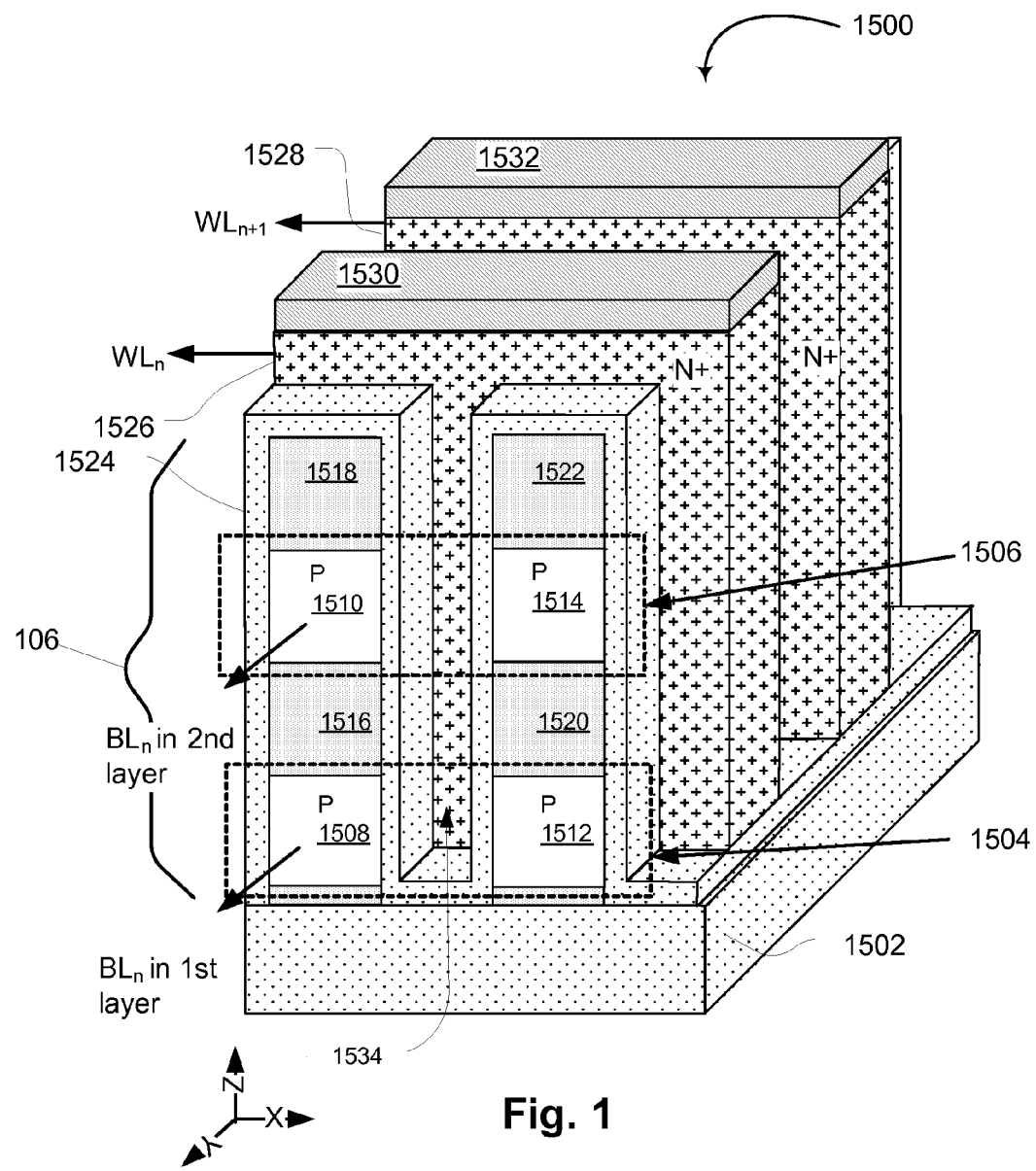
FIG. 1 is a perspective illustration of a 3D memory array including damascene conductor structures.

A detailed description of various embodiments is described with reference to the Figures. The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a perspective view of an example of a 3D memory device 1500 including damascene conductors. Various insulating materials are not shown to better illustrate memory stack and the damascene conductor structures, and others. As shown, 3D memory device 1500 is formed overlying a substrate having an insulating layer 1502 formed thereon. The substrate can include one or more integrated circuits and other structures. Only two planes 1504, and 1506 are shown but the number of planes can be extended to any number of layers N, where N is an integer having a value greater than one. In some examples, the number of planes can be equal to two, four, eight, sixteen, thirty-two or in general for binary decoding of the planes, $2^n$ layers. As shown, the 3D memory device includes stacks of active strips 1508, 1510, 1512, and 1514 separated by insulating material 1516, 1518, 1520, and 1522. Each of the active strips includes a semiconductor material suitable to act as a channel region in the illustrated embodiment. The stacks are ridge-shaped extending on the Y-axis as illustrated, so that the active strips 1508, 1510, 1512, and 1514 can be configured as bodies including channel regions of flash memory cell strings, for example in horizontal NAND string configurations. In other embodiments, the active strips can be configured as word lines for vertical NAND string configurations. See for example, commonly owned U.S. Patent Application Publication No. 2012/0182808, filed 19 Jan. 2011, entitled Memory Device, Manufacturing Method And Operating Method Of The Same, by inventors Hang-Ting Lue and Shi-Hung Chen, which is incorporated by reference as if fully set forth herein.

Active strips 1508 and 1512 can act as channel regions for memory cell strings in a first memory plane 1504. Active strips 1510 and 1514 can act as channel regions for memory cell strings in second memory plane 1506. As illustrated, a layer 1524 of memory material coats the plurality of stacks of active strips in this example, and at least on the side walls of the active strips in other examples.

In the embodiment of FIG. 1, a plurality of damascene conductors 1526, 1528 is arranged orthogonally over the plurality of stacks of active strips. The damascene conductors 1526, 1528 have surfaces conformal with the plurality of stacks of active strips, within the trenches (e.g. 1534) defined by the plurality of stacks, and defining a multilayer array of interface regions at cross-points between side surfaces of the active strips 1508, 1510, 1512, and 1514 on the stacks and damascene conductors 1526, 1528 (for example, word lines). Damascene conductors 1526 and 1528 can be formed using the method as in FIGS. 2-12. As shown, a layer of silicide (e.g. tungsten silicide, cobalt silicide, titanium silicide or nickel silicide) 1530, 1532 can be formed over the top surfaces of damascene conductors (for example, word lines) 1526, 1528.

Depending upon the implementation, layer 1524 of memory material can comprise multilayer dielectric charge storage structures. For example, a multilayer dielectric charge storage structure includes a tunneling layer comprising a silicon oxide, a charge trapping layer comprising a silicon nitride and a blocking layer comprising a silicon oxide. In some examples, the tunneling layer in the dielectric charge storage layer can comprise a first layer of silicon oxide less than about 2 nanometers thick, a layer of silicon nitride less than about 3 nanometers thick and a second layer of silicon oxide less than about 3 nanometers thick. In other implementations, layer 1524 of memory material can comprise only a charge trapping layer without the tunneling layer or the blocking layer. In the alternative an anti-fuse material such as a silicon dioxide, silicon oxynitride or other silicon oxides, for example having a thickness on the order of 1 to 5 nanometers, can be utilized. Other anti-fuse materials may be used, such as silicon nitride. For anti-fuse embodiments, active strips 1510 and 1514 can be a semiconductor material with a first conductivity type (e.g. p-type). Damascene conductors (for example, word lines) 1526, 1528 can be a semiconductor material with a second conductivity type (e.g. n-type). For example, the active strips 1510 and 1514 can be made using p-type polysilicon while the damascene conductors 1526, 1528 can be made using relatively heavily doped n+-type polysilicon. For anti-fuse embodiments, the width of the active strips should be enough to provide room for a depletion region to support the diode operation. As a result, memory cells comprising a rectifier formed by the p-n junction with a programmable anti-fuse layer in between the anode and cathode are formed in the 3D array of cross-points between the polysilicon strips and conductor lines.

In other embodiments, different programmable resistance memory materials can be used as the memory material, including metal oxides like tungsten oxide on tungsten or doped metal oxide, and others. Various kinds of programmable metallization material can also be implemented as the memory material to form programmable metallization cells (PMC). Some of such materials can form devices that can be programmed and erased at multiple voltages or currents, and can be implemented for operations storing multiple bits per cell.

FIGS. 2-11, 2A-7A, 9A-11A, 6B, 6C, 7B, 7C, 7D, 9B-11B, and 9C-11C illustrate stages of a method of forming a damascene conductor structure, for example, used as a word line or gate structure for a 3D memory device according to various embodiments. For high density devices, as the number of semiconductor planes, (for example, 1504 and 1506 in FIG. 1) increases, a high aspect ratio word line or gate (for example, 1526 and 1528 in FIG. 1) must be fabricated. Various defects such as stringers, residues, and critical dimension (CD) thinning can occur during patterning of a conductor material over the stacks of cells that make up the 3D memory device to act as the gate structure. A damascene process using a two material fill for forming an insulator fill can be used to achieve high aspect ratio structures where openings or trenches in the insulator fill act as molds for the conductor material used for the gate.

Figure 2:
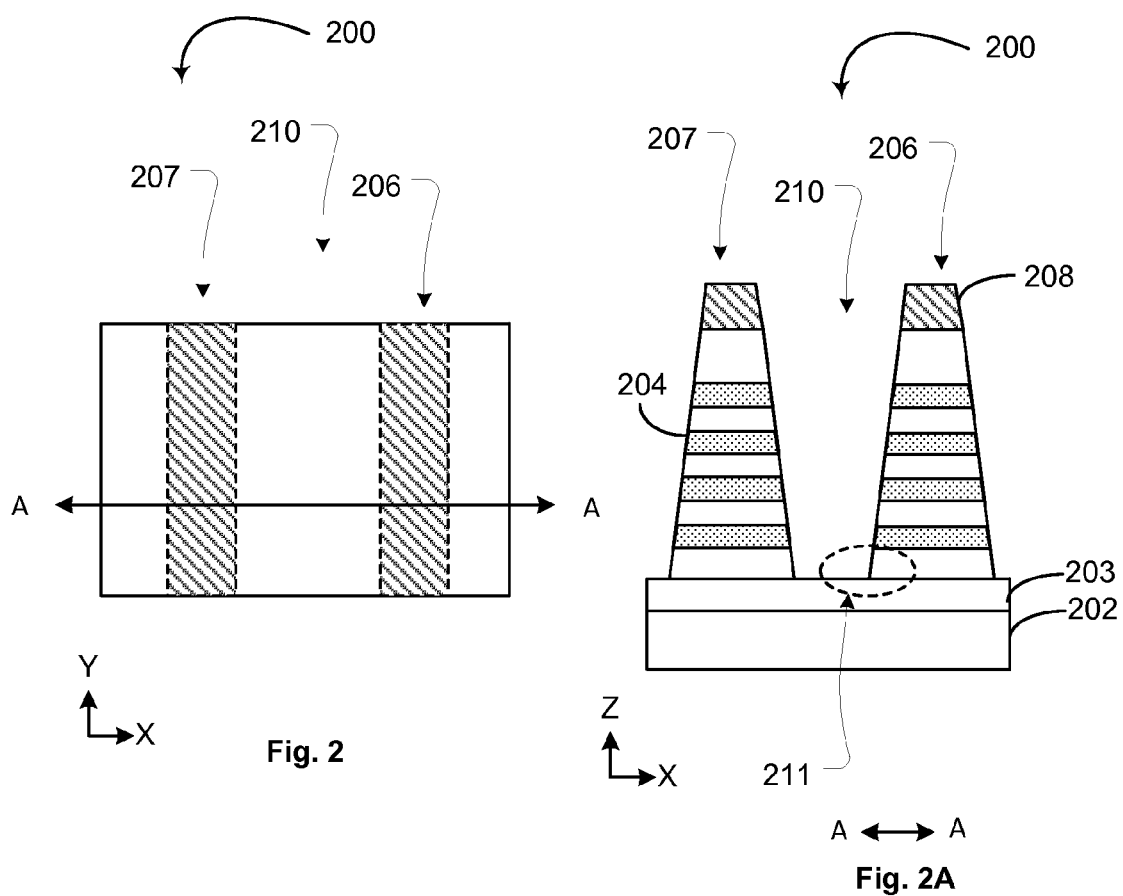

FIGS. 2 and 2A illustrate a stage of a manufacturing method for forming a damascene structure, for example a gate, for a 3D memory device. A partially formed memory device can be provided using technologies of commonly owned, co-pending U.S. Patent Application Publication No. 2012/0182806 filed 1 Apr. 2011, entitled Memory Architecture Of 3D Array With Alternating Memory String Orientation And String Select Structures, by inventors Shih-Hung Chen and Hang-Ting Lue, which is incorporated by reference as if fully set forth herein. A top view of partially formed memory device 200 is illustrated in FIG. 2, and a cross-sectional view along direction A-A across the ridges of the plurality of stacks of spaced-apart active strips (stack 106 in FIG. 1) is shown in FIG. 2A. As shown, partially formed memory device 200 includes a semiconductor substrate 202, which can be a single crystal silicon wafer, a silicon-on-insulator (SOI) substrate, a silicon germanium material, and others.

An insulator layer 203 is formed overlying substrate 202 to insulate spaced-apart stack of active strips (stack 106 in FIG. 1) from substrate 202. Insulator layer 203 can be silicon oxide, silicon nitride, a dielectric stack with alternating layers of silicon oxide and silicon nitride (commonly known as ONO), a high K dielectric, a low K dielectric, and others.

The spaced-apart stack of active strips includes N layers of active strips separated by layers of a suitable insulator, where N is an integer greater than 1, including for example 2, 4, 8, 16, 32, and so on. The strips comprise an active material 204 which in this example is a semiconductor configured as a bit line conductor for the 3D memory device. Depending on the implementation, active material 204 can be made from a suitably undoped or doped silicon material and from other semiconductor materials.

As shown, a partially formed memory device includes a cap layer 208, which is a hard mask used for patterning of stack 106 in various embodiments. Cap layer 208 can be silicon nitride in various embodiments. At the stage of manufacturing illustrated in FIG. 2A, the structure can have been made by depositing alternating layers of active material and insulating material, with a hard mask material over the stack. Then a lithographic process, or other patterning process, is used to etch through the alternating layers to form the ridge shaped stacks separated by trenches extending in this example in the y-direction. Thus, stack 206 is separated by a gap 210, as shown from stack 207, and the pattern repeats for many such parallel stacks that make up the array. A charge trapping memory material or other types of memory material (layer 1524 in FIG. 1, not shown to simplify the figure) can be provided over stacks 206 and 207. Corners (e.g. 211) at the bottom of the stacks 206, 207 results from the etch process. Preferably, the corners are straight, in the sense that the horizontal and vertical sides at the corners are straight and the sides meet at a sharp angle. In practical implementations, the corner will be somewhat rounded.

Figure 3:
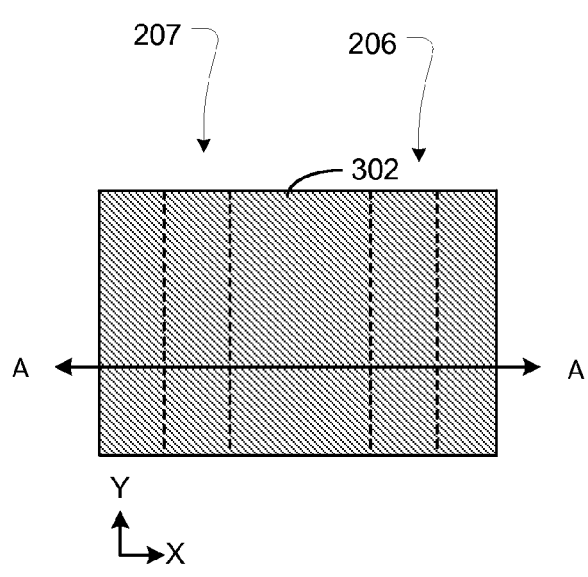
Figure 3A:
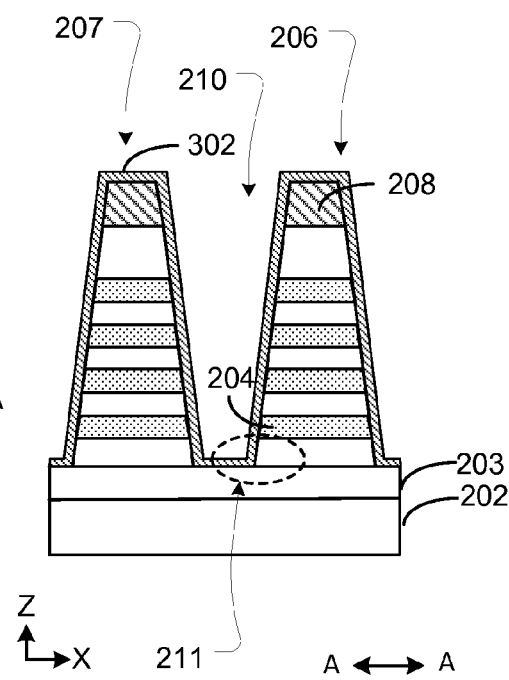

FIGS. 3 and 3A illustrate a plan view (in which the stacks 206 and 207 are shown in outline) and a cross-sectional view at a next stage in the process, after depositing a lining 302 over the stacks 206 and 207, lining the sidewalls and the underlying exposed insulator layer 203 at the bottom of the trenches. As illustrated, the lining 302 fills the corner 211 with a thin film and covers the sidewalls of the stacks 206, 207. The lining 302 can be a first insulator material, for example, a first silicon oxide. The first silicon oxide can be a low quality oxide having a relatively high (or fast) wet etch rate in a hydrofluoric acid (HF) solution. The low quality oxide may be deposited using a plasma enhanced chemical vapor deposition (PE-CVD) using tetraethylorthosilicate (TEOS) as silicon oxide precursor. PE-CVD oxide of this type can have a high wet etching rate of about 40 nanometer per minute in a buffered oxide etch (BOE) process using a 100:1 buffered HF comprising a NH4F:HF volume ratio of about 100:1. The wet etching rate is measured from oxide thickness on a blanket wafer before and after the wet etching process. Other such low quality oxides can include a low temperature oxide deposited using silane or dichchlorosilane and an oxidizing species (oxygen or nitrous oxide).

FIGS. 4 and 4A illustrate a following stage in the process after deposition of second insulator material 402 as an insulating fill material to fill the gaps (e.g. gap 210) between the stacks 206, 207. The second insulator material 402 overlies the lining 302, filling gap 210. Second insulator material 402 can be a second silicon oxide selected to have a higher density than the first silicon oxide. In various embodiments, second insulator material 402 is characterized by a slower wet etch rate (for example ⅓ or less) than the wet etch rate of the material of the lining 302 for a same etch chemistry (for example, a wet etching process such as a buffered oxide etch). Additionally, second insulator material 402 should have a good gap fill property as an isolation material for conductors (for example gate structures) to be fabricated. Examples of second insulator material can include silicon oxide deposited by a chemical vapor deposition process and a thermal decomposition of TEOS. TEOS oxide of this kind can have a low wet etching rate of about 3 nanometers per minute in a buffered oxide etch using a 100:1 buffered HF comprising a NH4F:HF volume ratio of about 100:1. The wet etching rate is measured from oxide thickness on a blanket wafer before and after the wet etching process. This etching rate is less than ⅓ the wet etching rate of a PE-CVD TEOS oxide, which can be used as the lining 302, as discussed above. A smaller the ratio of the etching rates of the lining 302 to insulating material 402 can result in more vertical the sidewalls of the trenches, and therefore of the conductive lines being formed. It is desirable for the etching rate for the second insulator material 402 during the etch process used to remove the lining 302 be less than ⅓, or even less than ⅒, or less of the etching rate of the lining.

Figures 5, 5A:
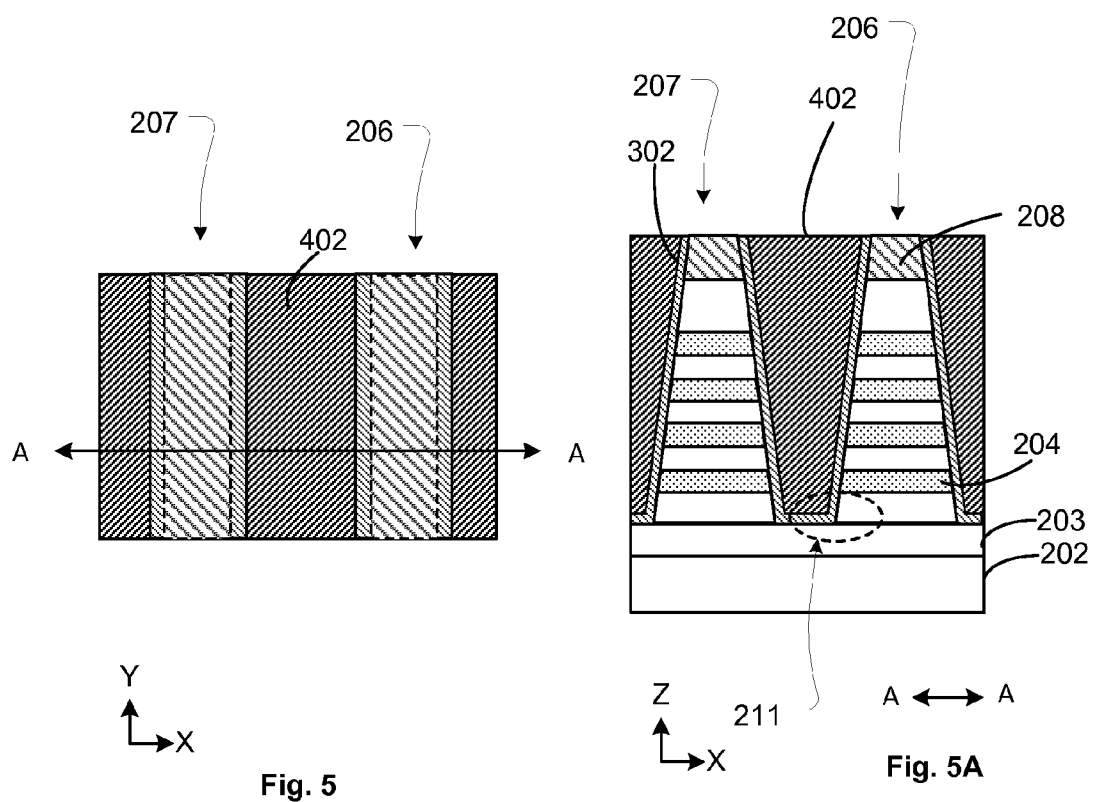

FIGS. 5 and 5A illustrate the structure in a stage after that shown in FIGS. 4 and 4A following planarization of second insulator material 402. The second insulator material 402 is subjected to a planarization process to expose a surface of cap layer 208. The planarization process can be a plasma etch back process using fluorine bearing reactive ions using cap layer 208 as an etch stop. The fluorine bearing reactive ions may be derived from trifluoromethane ($CHF_3$), and others. Alternatively, the planarization process can be a chemical mechanical polishing process using cap layer 208 as a polish stop.

FIGS. 6, 6A, 6B, and 6C illustrate the structure in a stage after that shown in FIGS. 5 and 5A, following formation of a patterned mask 602 over planarized second insulator material 402 and exposed surfaces of cap layer 208. A second cross-sectional view from the line B-B between the mask strips 602 and along the direction in which trenches for formation of the damascene gates are to lie is illustrated in FIG. 6B. FIG. 6C illustrates a third cross section view from the line C-C in the y direction between spaced-apart stacks 206 and 207. Patterned mask 602 can be formed from a photosensitive material, for example, a photoresist, followed by a patterning process. Patterned mask 602 may be a hard mask made from an insulator material, a metal material, or others. As shown, patterned mask 602 is aligned orthogonal relative to stack of spaced-apart active strips 106 (for example, stacks 206, 207).

FIGS. 7, 7A, 7B and 7C illustrate the structure in a stage after that shown in FIGS. 6, 6A and 6B, after second insulator material 402 has been subjected to a first etching process using the patterned mask 602 as a masking layer to form a plurality of trenches, or openings 702. Opening 702 is aligned to extend orthogonal relative to the spaced-apart stacks of active strips 206, 207. The first etching process can be a plasma etch using fluorine species derived from, for example, trifluoromethane ($CHF_3$). Due to a high aspect ratio of gap 210, part of lining 302 can remain on the bottom and corners (e.g. 211) of opening 702. As shown, part of lining 302 can remain on the side walls of stacks 206, 207 exposed in opening 702, for example as stringers 703. In this etch step, the cap layer 208 can be partially removed as well in regions exposed to the etch, resulting in a reduced thickness as shown in FIG. 7B. As illustrated in FIGS. 7C and 7D, the opening 702 in the second insulator material 402 is opened to the insulator layer 203 in this example. Opening 702 has a corner 704 at the bottom characterized by an angle 708 defined by a substrate surface 710 (for example, insulator layer 203 surface) and exposed vertical wall 706 of the second insulator material 402. The angle 708 may be measured from a first line 712 that is best fit straight line for the surface of the exposed vertical wall 706 over a length that extends upwardly in the vertical direction (z direction) by the depth of the active strips and a second line 714 that is a best fit on the exposed surface 710 of the second insulating layer 203 in the bottom of the trenches. The angle 708 is close to right angle and no greater than about 95 degrees. The angle between vertical wall 706 and insulator layer surface can be close to 90 degrees. In some embodiments, the angle 708 can range between 90 degrees and no greater than about 95 degrees, between 90 degrees and no greater than 91 degrees, or between 90 degrees and no greater than about 92 degrees.

In various embodiments, due to the deep trench 702 of high aspect ratio and to maintain the vertical wall 706 during the first etch process, stacks 206 and 207 and materials therein may have to be exposed for a relatively long time to the first etching process. The lining 302 on the stacks 206, 207 enables the use of the first etch process for a shorter time, because it is not necessary to use the first etch process to remove the material in the corners. This prevents over etching that can cause the slope of the vertical wall to increase. Thus, the use of the lining enables the formation of more vertical side walls for the conductive lines, and a smaller pitch. Thus, angle between vertical wall 706 and insulator layer surface can be close to 90 degrees. In some embodiments, depending on the etch processes, the materials chosen, the thickness of the lining and the depth of the trenches, the angle 706 may be no greater than 95 degrees, no greater than 92 degrees, or no greater than 91 degrees.

Figure 8:
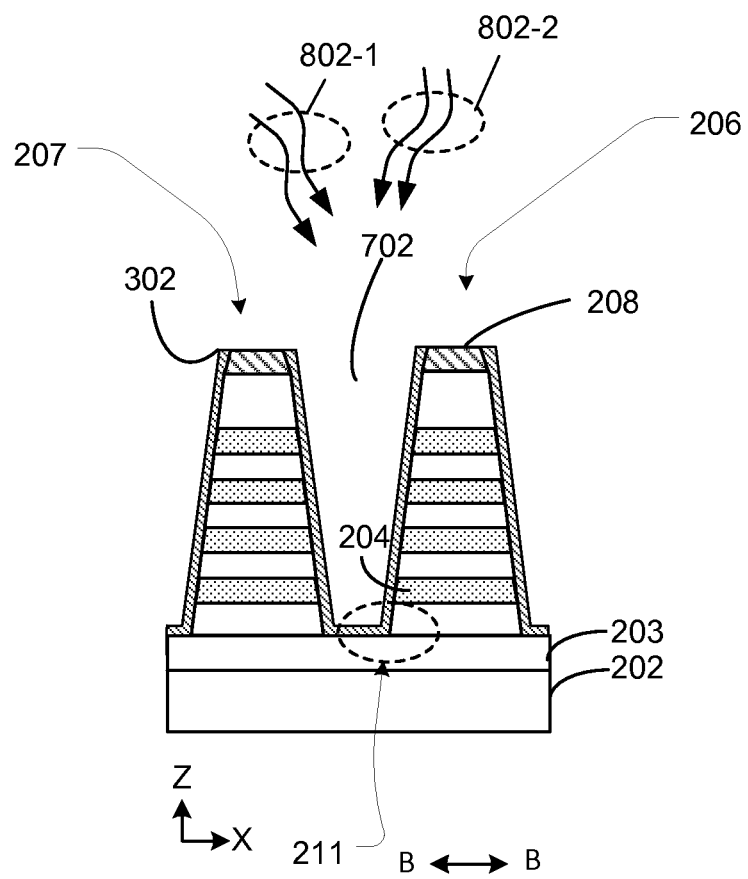

FIG. 8 is a cross-section like that of FIG. 7B taken on line B-B of FIG. 7, illustrating a next stage that can be applied for some embodiments. In this stage, the remaining portions of lining 302 can be weakened by subjecting it to radiation in the form, for example, of energized ions or particles 802-1 and 802-2, or other form of radiation. The radiation can be accelerated ions or electrically neutral particles derived from an inert gas (for example, argon, nitrogen, helium, or others). The radiation may be provided by an ion implanter in certain implementations. Further, the radiation can also be provided at more than one incident angle as indicated by the arrows 802-1 and 802-2, in order to cover the residual portions of the lining 302 exposed in the bottoms of the openings (for example, 702) as well as side walls of stacks 206, 207. The radiation 802-1, 802-2 can weaken the residue of the lining 302 without substantial deleterious changes to the properties of the remaining structure, including, for example, active material 204 in stack 206.

Figure 9:
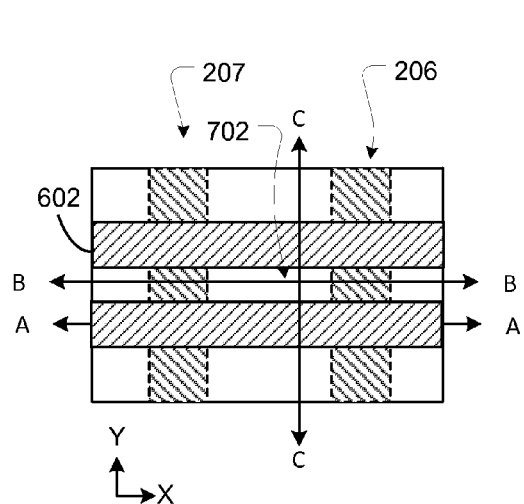
Figure 9A:
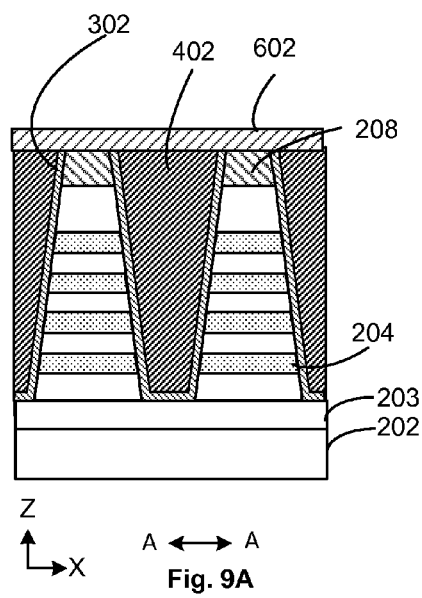
Figure 9C:
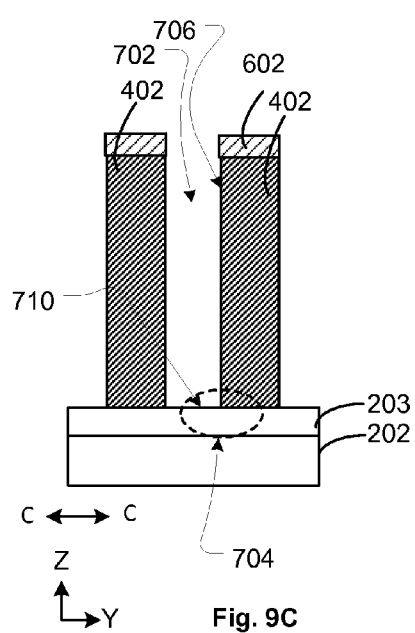
Figure 9B:
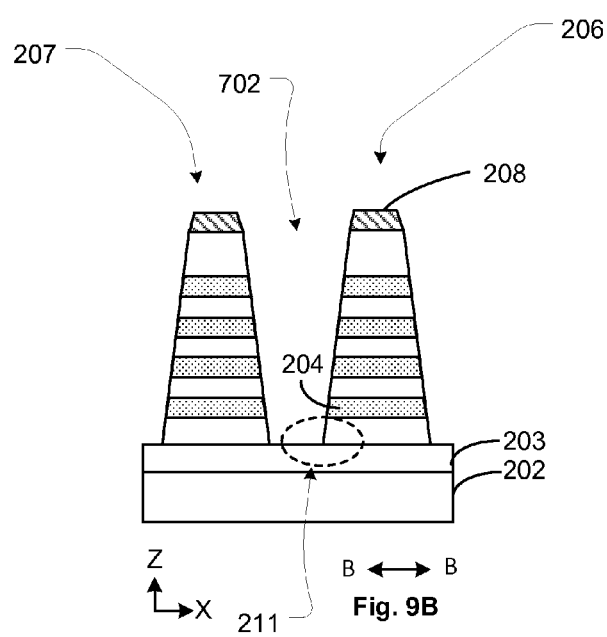

FIGS. 9, 9A, 9B, and 9C illustrate the structure in a stage after that shown in FIG. 8, following removal of the residue lining 302 from inside the opening 702, optionally weakened as mentioned above. As illustrated, the residue of the lining 302, after being weakened, is substantially completely removed using a second etch process. The second etch process includes a wet etch process. For the first silicon oxide as lining 302, the wet etch process can be a buffered oxide etch (BOE) using buffered hydrofluoric acid (HF) to better control a wet etch rate. The buffered hydrofluoric acid can comprise ammonium fluoride ($NH_4F$) and hydrofluoric acid (HF) solutions in a suitable ratio for a desirable wet etch rate for the weakened lining 302 without etching of the insulating fill material 402. Various species such as ammonium ion ($NH_4^+$), fluoride ion ($F^-$), hydrogen ion ($H^+$), hydroxyl ion ($OH^-$), and others are present in the buffered hydrofluoric acid. As noted, the first silicon oxide for lining 302 is selected to have an etch rate of greater than about 10 times, or at least 3 times, that of the second silicon oxide for second insulator material 402 for the wet etch process. The weakened residue of the lining 302 would have an even higher etch rate, so the second etch process can more completely remove the residue of lining 302 without removal of second insulator material 402. This process preserves the profile of the stack 106 to a significantly improved degree, as a result of substantially clean removal of the lining from inside opening 702, even in the corners 211. The profile of the trench opening 702 including the corner 704 is also preserved. The angle 708 between side wall 706 relative to substrate surface 203 can remain near 90 degrees. The angle 708 can range from about vertical to about 95 degrees, about vertical to about 92 degrees, or about vertical to about 91 degrees. As illustrated, the hard mask 208 exposed to the etch can also be eroded to some degree at this stage of the process (FIG. 9B).

Figure 10:
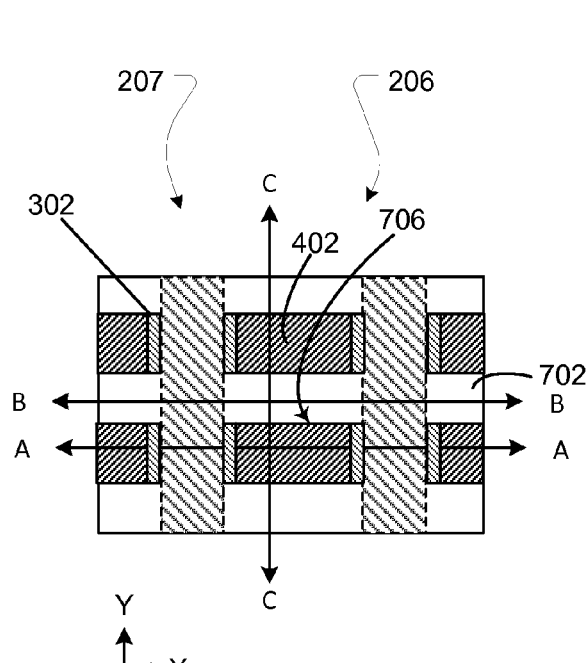
Figure 10A:
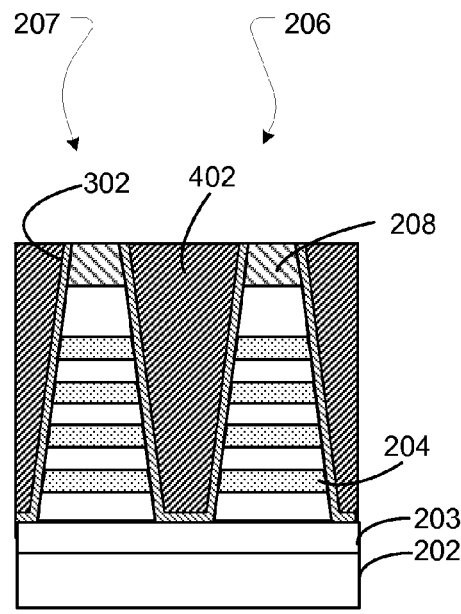
Figure 10C:
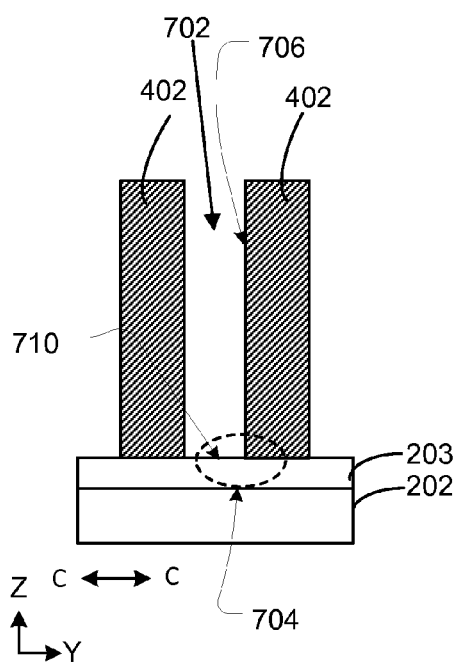
Figure 10B:
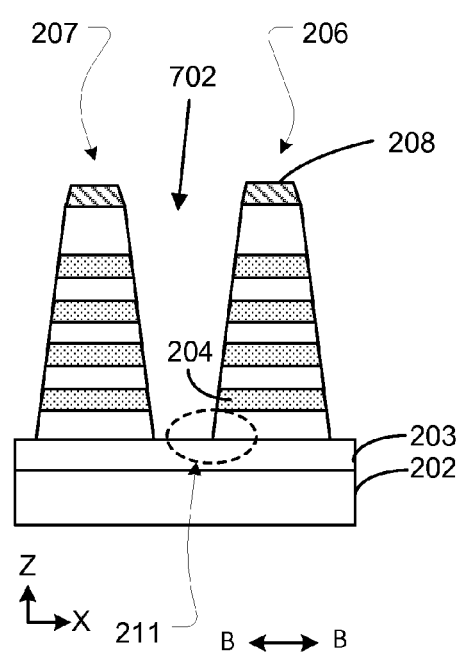

FIGS. 10, 10A, 10B and 10C show the structure in a stage after that shown in FIGS. 9, 9A, and 9B, following removal of patterned mask 602. FIG. 10B is a cross-section in the x-direction taken along the line B-B, illustrates that the stacks 206, 207 have sidewalls exposed in trenches 1002. FIG. 10A is a cross sectional view in the x-direction taken along the line A-A through the second insulator material strips 402. Also, the eroded cap layer 208 has a lower surface on stacks 206, 207 abutting the trench 702 than the surface of the cap layer 208, as shown in FIG. 10A, abutting second insulation material strips 402. As illustrated in FIG. 10C, the trenches 702 in the second insulator material 402 are opened to the insulator layer 203 As discussed, each of the trenches has the vertical wall 706 substantially perpendicular to the insulator layer surface 710. The plurality of trenches (for example, 702) provides molds for a plurality of damascene conductor structures (for example, gate structures) for the 3D memory device. As further shown in various views in FIGS. 10, 10A, 10B, and 10C, the profile of each of the spaced apart active strips 106 (for example, 206, 207) is substantially maintained and there is little or no insulating material residue on the sides of the active strips.

Next, a conductor material 1102 is deposited to fill each of the plurality of trenches 702 using techniques such as a chemical vapor deposition (CVD) process, a physical vapor deposition (PVD) process, or a combination, and others. Conductor material 1002 can be doped polysilicon (p+ doped or n+ doped) or a metal material. In certain embodiments, conductor material 1102 can be subjected to a planarization process to remove conductor material 1102 from a second insulator material 402 surface to form a plurality of damascene conductors (for example, gate structures), electrically insulated and physically isolated by second insulator material 402 for the 3D memory device.

Figure 11:
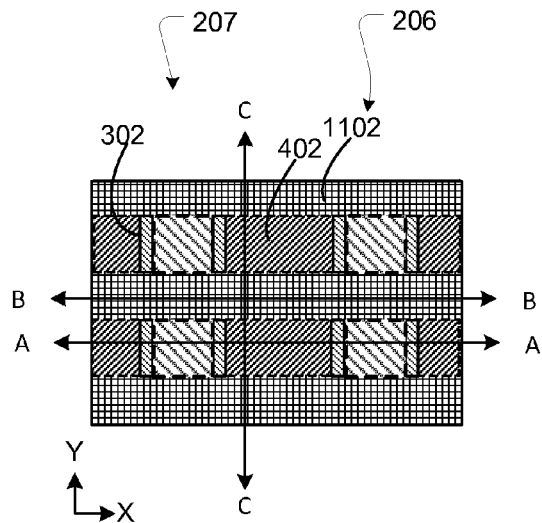
Figure 11A:
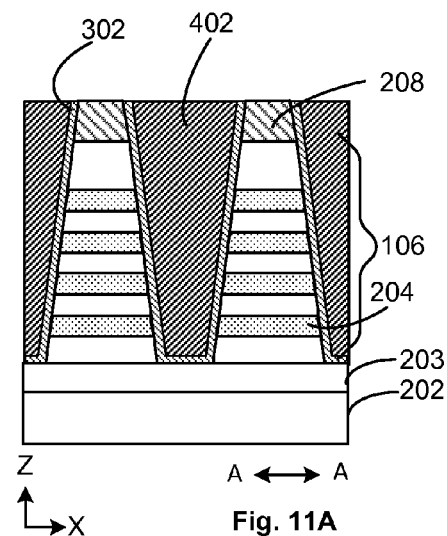
Figure 11C:
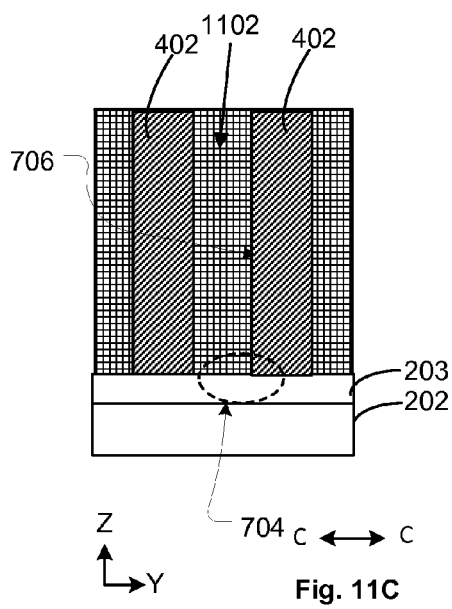
Figure 11B:
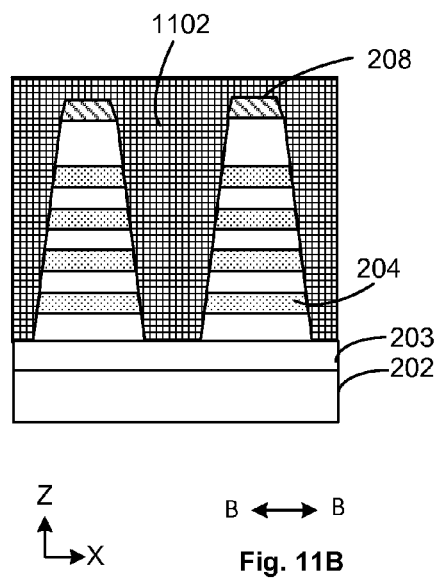

FIGS. 11, 11A, 11B, and 11C show the structure including active layers 204 (for example, memory layers) in a stage after that shown in FIGS. 10, 10A, 10B, and 10C following deposition of conductor material 1102 and removal of conductor material 1102 from second insulator material 402 surface. FIG. 11 is a plan view, showing strips of the conductor material 1102 arranged as word lines crossing over the stacks 206, 207. The conductor material 1102 can be a semiconductor material such as a polysilicon material having a suitable impurity characteristic (p+ type or n+ type) depending on the application. Depending on the implementation, a silicide (not shown) (for example, cobalt silicide, nickel silicide, tungsten silicide, titanium silicide, and others) can be formed over the polysilicon material to improve electrical conductivity of the polysilicon material. For anti-fuse applications, polysilicon conductor material 1102 should have an opposite polarity to polysilicon active material 204 in spaced-apart stack of active strips 106 (for example, 206, 207). In certain embodiments, conductor material 1102 can be a conductive material such as a metal material, or a combination of materials. FIG. 11A illustrates a cross-section in the x-direction between the word lines, in which the stacks with cap layer 208 and the second insulator material 402 between the stacks 206, 207 separates the word lines and extend to the surface of insulation layer 203 are shown. Further illustrated in FIGS. 11 and 11A, second insulator material 402 is lined with lining 302. FIG. 11B illustrates a cross-section in the x-direction along the word lines, in which conductor material 1102 forms a continuous, damascene conductor crossing over the stack and over the cap material 208.

FIG. 11C is a cross-section in the y-direction between stacks 106 (for example, 206, 207) on line C-C, illustrating that the conductor material between stacks 106 extends to the insulator layer 203 over substrate 202 and is separated into word lines by the second insulator material 402. The damascene conductor material 1102 can have a near vertical wall 706 adjoining the second insulator material 402, as discussed above.

Figure 12:
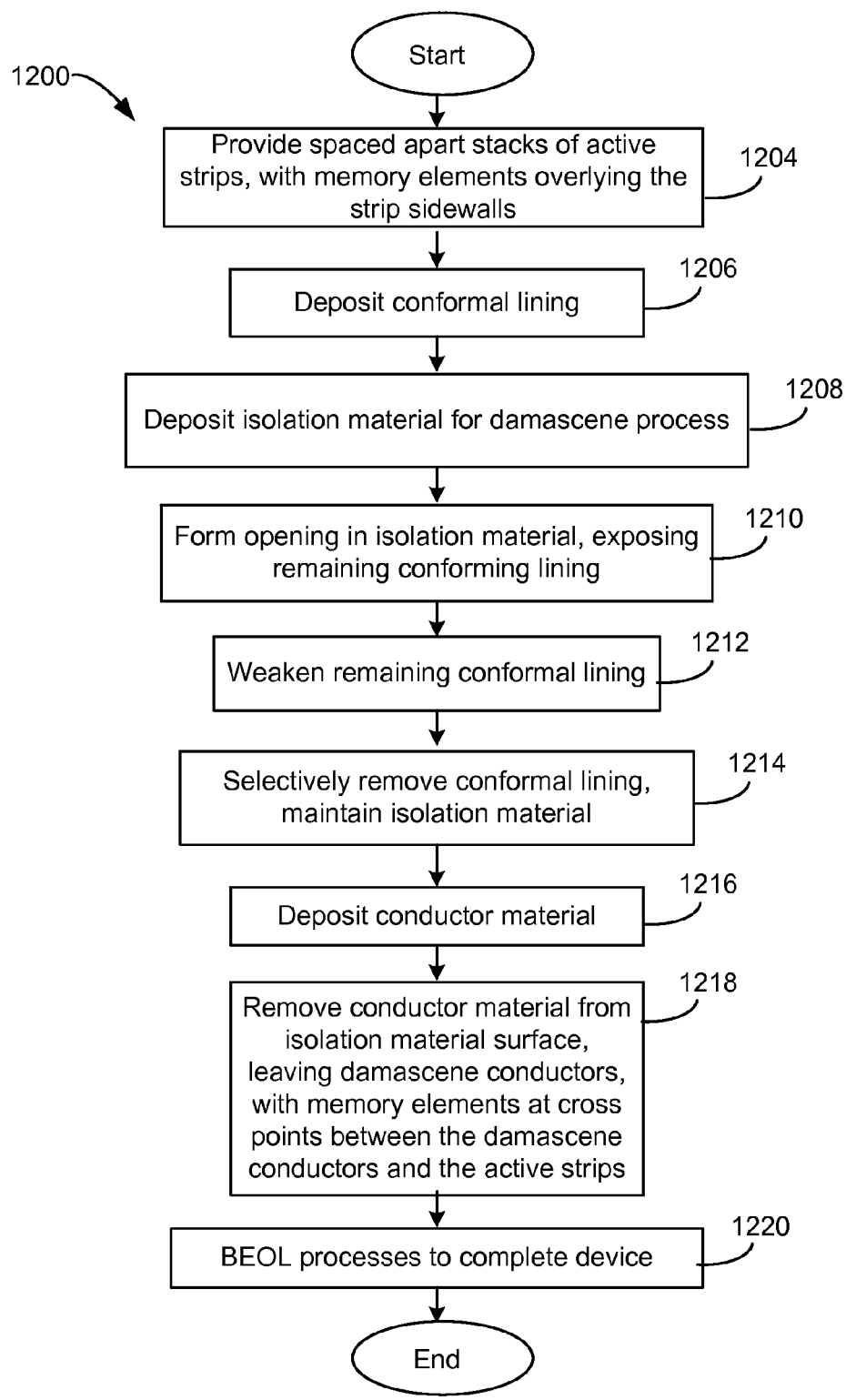
FIG. 12 is a process flow diagram for forming a conductor structure for a 3D memory device.

FIG. 12 is a simplified process flow 1200 for an example of a method of forming a conductor structure, for example a gate structure for a 3D memory device. The method includes the following steps:

Step 1204: provide a plurality of spaced apart stacks of active strips overlying a substrate, with memory elements such as a dielectric charge trapping structure, overlying the active strips.

Step 1206: deposit a lining 302 comprising a lining material over spaced-apart stacks 206, 207 of active strips. In one example, the lining is a PE-CVD deposited silicon oxide material.

Step 1208: deposit an insulating fill material 402 for a damascene process over and in between plurality of spaced-apart stacks of active strips 206, 207 where the insulating fill material has an etch rate that is slower than that of the lining 302. In one example, the insulating fill material is a thermally deposited TEOS silicon oxide, having an etch rate in BOE chemistries less than about 1/3 that of the PE-CVD deposited silicon oxide of the lining.

Step 1210: form a plurality of openings or trenches 702 in isolation material 402 and leaving a residue of the lining on at least a sidewall of spaced-apart stacks of active strips exposed in the openings as well as bottoms and corners of the openings.

Step 1212: weaken the residue of the lining using radiation, such as energized particles 802 so that the weakened residue of the lining is even more readily removed.

Step 1214: remove selectively the weakened lining while maintaining the insulating fill material 402 and spaced-apart stacks 206, 207 of active strips using for example, a wet etch process (for example a BOE) thereby leaving trenches in the insulating fill and crossing over the stacks 206, 207.

Step 1216: deposit conductor material (for example, gate material) 1102 to fill trenches 702 and over insulating fill material surface.

Step 1218: remove conductor material 1102 from insulating fill material 402 surface leaving damascene conductors with memory elements at cross points between the damascene conductors and the active strips.

Step 1220: complete construction of integrated circuit with other back end of line processes.

The above sequence of steps provides a method for forming a plurality of high aspect ratio conductor structures (for example, gate structures) for a high density 3D memory device having a plurality of spaced-apart stacks of active layers. The high aspect ratio conductor structures can be implemented as damascene conductor structures. Each of the high aspect ratio conductor structures is disposed in a high aspect ratio trench and characterized by a relatively vertical wall extended to insulator layer 203 over substrate 202 and by relatively straight corners. The high aspect ratio conductor structure is formed by a process (for example, a damascene process) using a two-step material fill and conforming complementarily to the spaced-apart stack of active layers. Further, a profile of the spaced-apart stack of active layers is maintained.

The present method has been described with reference to 3D memory devices. It is to be appreciated that the present method can be applied to a conductor structure having a substantially vertical side wall in trenches complimentary to a plurality of high aspect ratio ridge-like structures. The ridge-like structures can include spaced-apart stack of materials or a single material. The profile of the ridge-like structures is preserved from the two-step etching processes for forming of the trenches.

In various embodiments, the present technology provides a semiconductor device. The semiconductor device includes a substrate having a plurality of spaced apart stack of material, for example, material for active layers, formed thereon. An insulating fill material having a lining overlies the plurality of spaced apart stack of active layers and a plurality of conductors comprising a conductor material are disposed in trenches through the insulating fill material. In various embodiments, each of the trenches includes a side wall of the insulating fill material substantially perpendicular relative to a surface of the substrate. For example, the side wall can have an angle ranging from about vertical to about 95 degrees, about vertical to about 92 degree, or about vertical to about 91 degrees relative to the substrate surface. Depending on the implementation, the plurality of conductors can be implemented as damascene structures. In various embodiments, the lining is substantially completely removed inside the trenches. The lining comprises a material characterized by an etch rate greater than about 3 times faster than that for the insulating fill material for a selected etch process (for example, a wet etch process such as a buffered oxide etch). In certain implementations, the lining can be a first silicon oxide and the insulating fill material can be a second silicon oxide. The first silicon oxide can be formed using a plasma enhanced chemical vapor deposition process and the second silicon oxide can be formed using a chemical vapor deposition process using tetraethylorthosilicate (TEOS) as a precursor. The semiconductor device can include a memory material over each of the plurality of spaced apart stacks of active layers and memory elements at cross points between the active layers and the conductor structures. The conductor structures can be damascene structure in various embodiments. Depending on the application, the memory material can include at least a charge storage dielectric material for dielectric charge storage structures or other kinds of memory materials (for example, resistive memory materials). In various embodiments, the conductor structures (for example, as damascene structures) can be fabricated using, for example, using the process steps in FIGS. 2 through 12.

One aspect of the technology is a method of forming a semiconductor device; comprising:
providing a substrate and a plurality of spaced-apart stacks of material having an overlying lining over the substrate;
forming an insulating fill material between the plurality of spaced-apart stacks having the overlying lining; and
forming conductor in trenches between insulating fill material, the trenches being substantially free from the lining,
wherein the lining comprises a material characterized by an etch rate greater than about 3 times faster than that of the insulating fill material in a selective etch process.

In one embodiment of this aspect of the technology, each of the trenches comprises an exposed vertical surface of the insulating fill material and including an angle ranging from about vertical to about 95 degrees between said surface and the substrate surface.

In one embodiment of this aspect of the technology, each of the trenches comprises an exposed vertical surface of the insulating fill material and including an angle ranging from about vertical to about 92 degrees between said surface and the substrate surface.

In one embodiment of this aspect of the technology, each of the trenches comprises an exposed vertical surface of the insulating fill material and including an angle ranging from about vertical to about 91 degrees between said surface and the substrate surface.

One aspect of the technology is a semiconductor device; comprising: a substrate and a plurality of spaced apart stacks of material over the substrate; an insulating fill material between the plurality of spaced apart stacks; and conductor material in trenches between insulating fill material; wherein each of the trenches having a side wall of the insulating fill material defined by a slope profile including an angle between the side wall and a surface of the substrate, the angle ranging from about vertical to less than about 95 degrees.

In one embodiment of this aspect of the technology, said angle between the side wall and the surface of the substrate ranges from about vertical to less than about 91 degrees.

In one embodiment of this aspect of the technology, said angle between the side wall and the surface of the substrate ranges from about vertical to less than about 92 degrees.

In one embodiment of this aspect of the technology, the lining is characterized by an etch rate greater than about 3 times that of the insulating fill material in a selective etch process.

While the present invention is disclosed by reference to the preferred embodiments and examples detailed above, it is to be understood that these examples are intended in an illustrative rather than in limiting sense. It is contemplated that modifications and combinations will readily occur to those skilled in the art, which modifications and combinations will be within the spirit of the invention and the scope of the following claims.

The invention claimed is:

1. A method of forming conductors in a 3D circuit; comprising:
   providing a substrate having a plurality of stacks of active strips, adjacent stacks in the plurality of stacks being separated by gaps,
   wherein within each stack of active strips in the plurality of stacks of active strips, active strips alternate with insulating strips in a direction perpendicular to a surface of the substrate;
   depositing a lining over the plurality of stacks of active strips;
   depositing an insulating fill material over the lining, over and in between the stacks;
   using a first etch process, forming a plurality of trenches in the insulating fill material arranged to cross over the plurality of stacks, such that each trench of the plurality of trenches crosses orthogonally over multiple stacks of the plurality of stacks;
   using a second etch process, removing the lining exposed within the trenches; and
   filling the plurality of trenches in the insulating fill material with a conductor or semiconductor material to form damascene conductor structures.

2. The method of claim 1, wherein the lining has an etch rate greater than about 3 times faster than the insulating fill material for the second etch process.

3. The method of claim 1, wherein the lining comprises a first silicon oxide and the insulating fill material comprises a second silicon oxide.

4. The method of claim 1, wherein said depositing a lining comprises using a plasma-enhanced chemical vapor deposition process to form a silicon oxide.

5. The method of claim 1, wherein said depositing an insulating fill comprises using a chemical vapor deposition process using tetraethylorthosilicate (TEOS).

6. The method of claim 1, wherein the second etch process comprises a buffered oxide etch.

7. The method of claim 1, wherein said second etch process includes first weakening any residue of the lining using radiation, and then etching the lining.

8. The method of claim 7, including using an ion implanter to deliver the radiation.

9. The method of claim 8, wherein the radiation comprises energized particles of an inert gas.

10. The method of claim 1, wherein the second etch process comprises a buffered oxide etch process using a buffered hydrofluoric acid comprising ammonium ($NH_4^+$) species, fluoride ($F^-$) species, hydrogen ion ($H^+$) species, and hydroxyl ion ($OH^-$) species.

11. The method of claim 1, wherein the second etch process is characterized by an etch selectivity of greater than about 3 for the lining over the insulating fill material.

12. A method of forming a semiconductor device; comprising:
    providing a substrate and a plurality of stacks of material having an overlying lining over the substrate, adjacent stacks in the plurality of spaced-apart stacks being separated by gaps,
    wherein within each stack of material in the plurality of stacks of material, strips of material alternate with insulating strips in a direction perpendicular to a surface of the substrate;
    forming an insulating fill material between the plurality of stacks having the overlying lining; and
    forming conductor in trenches within the insulating fill material, the trenches being substantially free from the lining, such that the spaces separating the adjacent stacks are filled with the insulating fill material and the conductor;
    wherein the lining comprises a material characterized by an etch rate greater than about 3 times faster than that of the insulating fill material in a selective etch process.

* * * * *